(12) United States Patent
Kim et al.

(10) Patent No.: US 11,120,846 B2
(45) Date of Patent: Sep. 14, 2021

(54) SENSE AMPLIFIER BASED FLIP-FLOP CAPABLE OF RESOLVING METASTABLE STATE BY REMOVING UNINTENTIONAL CURRENT FROM OUTPUT NODES

(71) Applicant: SK hynix Inc., Gyeonggi-do (KR)

(72) Inventors: SungWoo Kim, Gyeonggi-do (KR); InHwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/598,795

(22) Filed: Oct. 10, 2019

(65) Prior Publication Data

US 2020/0135243 A1    Apr. 30, 2020

(30) Foreign Application Priority Data

Oct. 24, 2018  (KR) .................. 10-2018-0127379

(51) Int. Cl.

| G11C 7/06 | (2006.01) |
|---|---|
| H03K 3/037 | (2006.01) |
| G11C 7/20 | (2006.01) |
| G11C 7/10 | (2006.01) |
| H03K 3/356 | (2006.01) |
| H03K 17/042 | (2006.01) |
| H03F 3/45 | (2006.01) |
| G11C 11/41 | (2006.01) |

(52) U.S. Cl.
CPC .............. *G11C 7/065* (2013.01); *G11C 7/106* (2013.01); *G11C 7/20* (2013.01); *H03F 3/45179* (2013.01); *H03K 3/037* (2013.01); *H03K 3/0375* (2013.01); *H03K 3/356173* (2013.01); *H03K 17/04206* (2013.01); *G11C 7/1048* (2013.01); *G11C 11/41* (2013.01)

(58) Field of Classification Search
CPC .......... G11C 7/065; G11C 7/20; G11C 7/106; G11C 11/41; G11C 7/1048; H03K 3/037; H03K 17/04206; H03K 3/356173; H03K 3/0375; H03F 3/45179
See application file for complete search history.

(56) References Cited

U.S. PATENT DOCUMENTS

| 6,107,853 | A | * | 8/2000 | Nikolic | ............ | H03K 3/356191 327/211 |
|---|---|---|---|---|---|---|
| 6,297,682 | B1 | * | 10/2001 | Morishima | ............ | G11C 7/062 327/327 |
| 9,543,904 | B1 | * | 1/2017 | Qu | ........................ | G11C 29/028 |
| 2004/0008068 | A1 | * | 1/2004 | Kim | ................. | H03K 3/356139 327/218 |

(Continued)

FOREIGN PATENT DOCUMENTS

KR    10-2006-0114055    11/2006

*Primary Examiner* — Mushfique Siddique
(74) *Attorney, Agent, or Firm* — IP & T Group LLP

(57) ABSTRACT

A semiconductor integrated circuit includes a sense amplifier circuit suitable for generating differential output signals by sensing and amplifying a level difference of differential input signals in response to a clock signal, and outputting the differential output signals to first and second nodes, respectively, a latch circuit suitable for feeding back and latching the differential output signals between the first and second nodes, and a control circuit suitable for controlling the feedback of the differential output signals between the first and second nodes in response to an initialization signal.

17 Claims, 4 Drawing Sheets

(56) References Cited

U.S. PATENT DOCUMENTS

| | | | | |
|---|---|---|---|---|
| 2006/0220718 A1* | 10/2006 | Kang | ............... | H03K 3/356139 |
| | | | | 327/218 |
| 2006/0221723 A1* | 10/2006 | Kang | .................... | H03K 3/012 |
| | | | | 365/189.05 |
| 2007/0024337 A1* | 2/2007 | Teh | .................. | H03K 3/356139 |
| | | | | 327/172 |
| 2007/0290734 A1* | 12/2007 | Teh | .................. | H03K 3/356139 |
| | | | | 327/218 |
| 2013/0257493 A1* | 10/2013 | Dike | ................... | H03K 3/0375 |
| | | | | 327/155 |
| 2015/0311875 A1* | 10/2015 | Chen | ...................... | G11C 7/065 |
| | | | | 327/52 |

\* cited by examiner

SENSE AMPLIFIER BASED FLIP-FLOP CAPABLE OF RESOLVING METASTABLE STATE BY REMOVING UNINTENTIONAL CURRENT FROM OUTPUT NODES

CROSS-REFERENCE TO RELATED APPLICATION

This application claims priority under 35 U.S.C. § 119 to Korean Patent Application No. 10-2018-0127379 filed on Oct. 24, 2018, which is incorporated herein by reference in its entirety.

BACKGROUND

1. Field

Exemplary embodiments relate to a semiconductor integrated circuit and, more particularly, to a flip-flop including a sense amplifier and a latch.

2. Discussion of the Related Art

In an electronic system, a processor or semiconductor memory device requires a data storage means such as a register, in order to temporarily store various data. That is, a register is used as a small-sized data memory device which is disposed in a processor or in a semiconductor memory device.

A register generally has a configuration in which a number of flip-flops are coupled. This is because it is possible to easily and quickly read and write data. For example, a time required for storing data in a register is usually several tens of nanoseconds or less, which is much faster than a main memory device such as a dynamic random access memory (DRAM).

In general, a flip-flop is a semiconductor device which is used in a semiconductor integrated circuit to store and output a state of an inputted signal or to maintain a previous state thereof. There are many types of flip-flops, and they need to be selected in conformity with a required use.

Speed, power consumption, clock skew error, and layout area are important parameters in the design of a high-performance semiconductor integrated circuit. A flip-flop has a substantially large impact on determining these parameters and is an essential element in determining a high-performance semiconductor integrated circuit.

SUMMARY

Various embodiments are directed to a flip-flop capable of removing an unintentional current from output nodes.

In accordance with an embodiment of the present invention, a semiconductor integrated circuit may include: a sense amplifier circuit suitable for generating differential output signals by sensing and amplifying a level difference of differential input signals in response to a clock signal, and outputting the differential output signals to first and second nodes, respectively; a latch circuit suitable for feeding back and latching the differential output signals between the first and second nodes; and a control circuit suitable for controlling the feedback of the differential output signals between the first and second nodes in response to an initialization signal.

In accordance with an embodiment of the present invention, a semiconductor integrated circuit may include: a reset circuit suitable for resetting a clock signal in response to an initialization signal which is activated to a logic low level within an initial operation period; a sense amplifier circuit suitable for generating differential output signals by sensing and amplifying a level difference of differential input signals in response to the reset clock signal, and outputting the generated differential output signals to first and second nodes, respectively; and a latch circuit suitable for feeding back and latching the differential output signals between the first and second nodes.

In accordance with an embodiment of the present invention, a flip-flop may include: a sense amplifier circuit suitable for generating differential output signals by sensing and amplifying a level difference of differential input signals in response to a clock signal, and outputting the differential output signals to first and second nodes, respectively; a latch circuit including first and second inverters which are coupled in the form of an inverter chain between the first and second nodes, and suitable for latching the differential output signals; a first NMOS transistor coupled between the first inverter and a terminal of a ground voltage, and suitable for receiving a power supply voltage through a gate thereof; and a second NMOS transistor coupled between the second inverter and the terminal of the ground voltage, and suitable for receiving an initialization signal through a gate thereof.

In accordance with an embodiment of the present invention, a integrated circuit may include: a differential amplifier configured to amplify differential signals from first and second input nodes and output amplified differential signals to first and second output nodes, respectively; a latch configured to feedback and latch the amplified differential signals between the first and second output nodes; a pre-charger configured to precharge the first output node to a logic high level in response to a control signal enabled at an initial operation of the amplifier; and a blocking circuit configured to block the feedback from the second node to the first node in response to the control signal.

In the present technology, in a sense amplifier-based flip-flop, it is possible to prevent differential output nodes from being driven to unclear logic levels during an initial operation period of the sense amplifier based flip flop. During the initial operation period, it is possible to block current paths between the differential output nodes and quickly precharge the differential output nodes to desirable initial values. To this end, the initial value of a clock signal which controls a sense amplifier may be held, and feedback between the differential output nodes may be controlled.

By quickly precharging the differential output nodes of the flip-flop, it is possible to reduce the loads applied to the differential output nodes. As a consequence, a time required for the setup/hold or output of the flip-flop may be reduced and thus performance may be improved. Further, it is possible to prevent a logic error due to unclear logic levels to which the differential output nodes of the flip-flop are driven.

DETAILED DESCRIPTION

Figure 1:
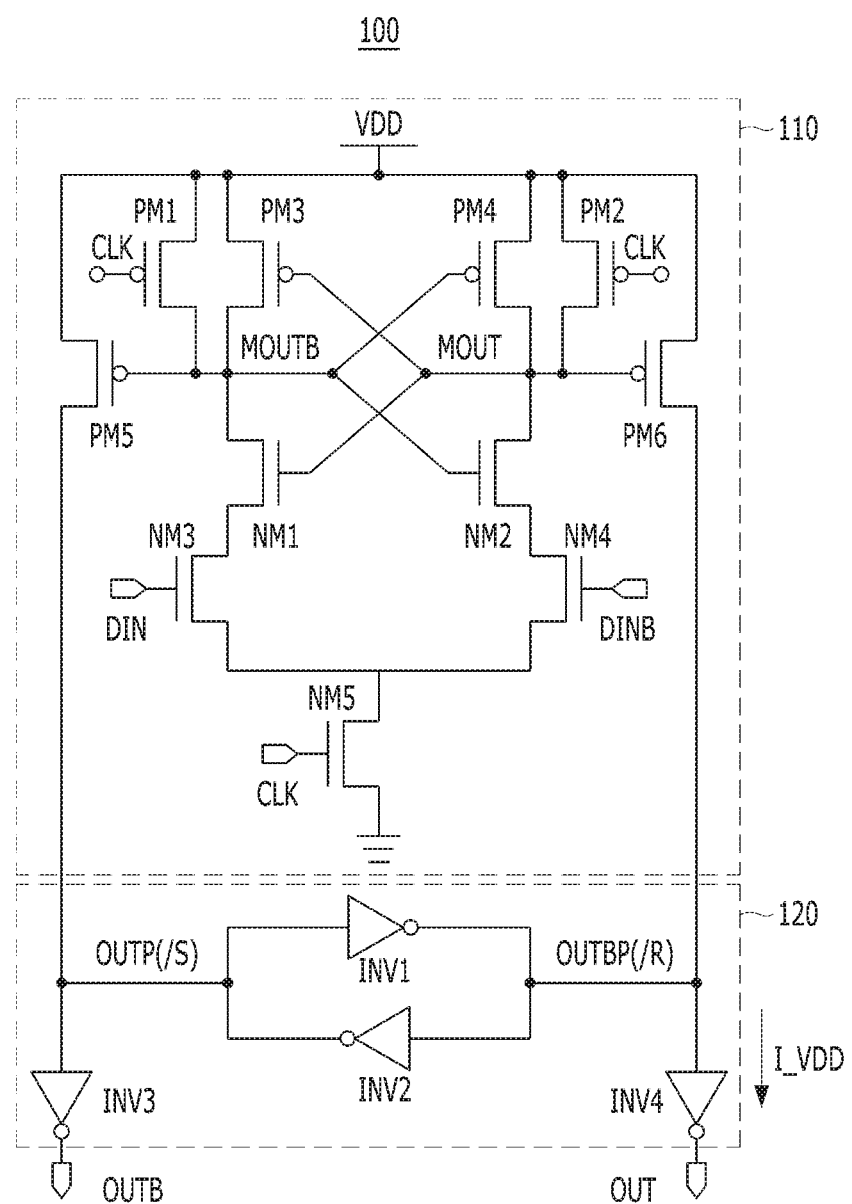
FIG. 1 is a circuit diagram illustrating a sense amplifier-based flip-flop.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a circuit diagram illustrating a sense amplifier-based flip-flop 100. The sense amplifier-based flip-flop (SAFF) 100 may be implemented by two stages including a sense amplifier circuit 110 as a first stage and a latch circuit 120 as a second stage. The sense amplifier circuit 110 receives differential input signals DIN and DINB and is controlled by a clock CLK, and the latch circuit 120 receives and latches the output signals of the sense amplifier circuit 110.

The sense amplifier circuit 110 of the first stage may be implemented by using the structure of a sense amplifier generally known in the art, and be typically configured by using a plurality of PMOS transistors and NMOS transistors. In detail, the sense amplifier circuit 110 may include first and second PMOS transistors PM1 and PM2. The first and second PMOS transistors are respectively coupled between the terminal of a power supply voltage VDD and intermediate output nodes MOUTB and MOUT and receive the clock CLK through the gates thereof. The sense amplifier circuit 110 may include third and fourth PMOS transistors PM3 and PM4. The third and fourth PMOS transistors are coupled in parallel with the first and second PMOS transistors PM1 and PM2, respectively, and the gates of the third and fourth PMOS transistors are cross-coupled with the intermediate output nodes MOUTB and MOUT, respectively. The sense amplifier circuit 110 may include fifth and sixth PMOS transistors PM5 and PM6. The fifth and sixth PMOS transistors are respectively coupled between the terminal of the power supply voltage VDD and differential output nodes OUTP and OUTBP of the sense amplifier circuit 110 and the gates of the fifth and sixth PMOS transistors are coupled to the intermediate output nodes MOUTB and MOUT, respectively.

The sense amplifier circuit 110 may include first and second NMOS transistors NM1 and NM2. The first and second NMOS transistors are coupled to the third and fourth PMOS transistors PM3 and PM4, respectively, and the gates of the first and second NMOS transistors are cross-coupled with the intermediate output nodes MOUTB and MOUT, respectively. The sense amplifier circuit 110 may include third and fourth NMOS transistors NM3 and NM4. The third and fourth NMOS transistors are coupled to the first and second NMOS transistors NM1 and NM2, respectively, and the gates of the third and fourth NMOS transistors receive the differential input signals DIN and DINB, respectively. The sense amplifier circuit 110 may include a fifth NMOS transistor NM5. The fifth NMOS transistor NM5 is coupled between the third and fourth NMOS transistors NM3 and NM4 and the terminal of a ground voltage, and the gate of the fifth NMOS NM5 receives the clock CLK.

The sense amplifier circuit 110 may sense and amplify the signal level difference between the differential input signals DIN and DINB. In the case where the clock CLK is logic low, the sense amplifier circuit 110 may precharge the differential output nodes OUTP and OUTBP to the level of the power supply voltage VDD through the intermediate output nodes MOUTB and MOUT. In the case where the clock CLK is logic high, the sense amplifier circuit 110 may sense and amplify the differential input signals DIN and DINB and drive the differential output nodes OUTP and OUTBP.

The signals of the differential output nodes OUTP and OUTBP of the sense amplifier circuit 110 may be inputted and latched as two input signals /S and /R of the latch circuit 120. The first input signal /S of the latch circuit 120 may be a set input, and the second input signal /R may be a reset input. That is, if the first input signal /S is logic low, a first output signal OUTB of the latch circuit 120 may be set to logic high, and if the second input signal /R is logic low, a second output signal OUT of the latch circuit 120 may be set to logic high.

The latch circuit 120 may include four inverters INV1 to INV4. The latch circuit 120 may include first and second inverters INV1 and INV2 which are coupled in the form of an inverter chain between the differential output nodes OUTP and OUTBP of the sense amplifier circuit 110. The latch circuit 120 may further include third and fourth inverters INV3 and INV4 which are coupled to the differential output nodes OUTP and OUTBP, respectively, of the sense amplifier circuit 110.

An SAFF is widely used because of its differential characteristic, fast operating speed, and low power consumption. Such an SAFF can be implemented in digital circuits such as microprocessors and digital signal processing (DSP) units, in a variety of ways. The SAFF may serve as a receiver of a high speed input/output interface such as a synchronous dynamic random access memory (SDRAM) or a phase detector (PD) of a delay-locked loop (DLL).

However, in the SAFF 100 controlled by the clock CLK, in the case where the clock CLK is logic high in an initial operation, the outputs of the sense amplifier circuit 110 may be driven to the level of a half power supply voltage VDD/2, which causes the outputs as maintained in a metastable state. That is, the output voltage of the sense amplifier circuit 110 may not reach a level that may be determined as logic high or logic low, and may be maintained at an uncertain level. Due to this fact, a static current path may be formed, and a logic error may occur.

Conversely, in the case where the clock CLK is logic low in an initial operation, both outputs of the sense amplifier circuit 110 may be driven to logic high levels. Therefore, inputs to the latch circuit 120 may become in a floating state. Due to this fact, as the outputs of the latch circuit 120 become in a metastable state, a substantial amount of leakage current may be caused.

Figure 2:
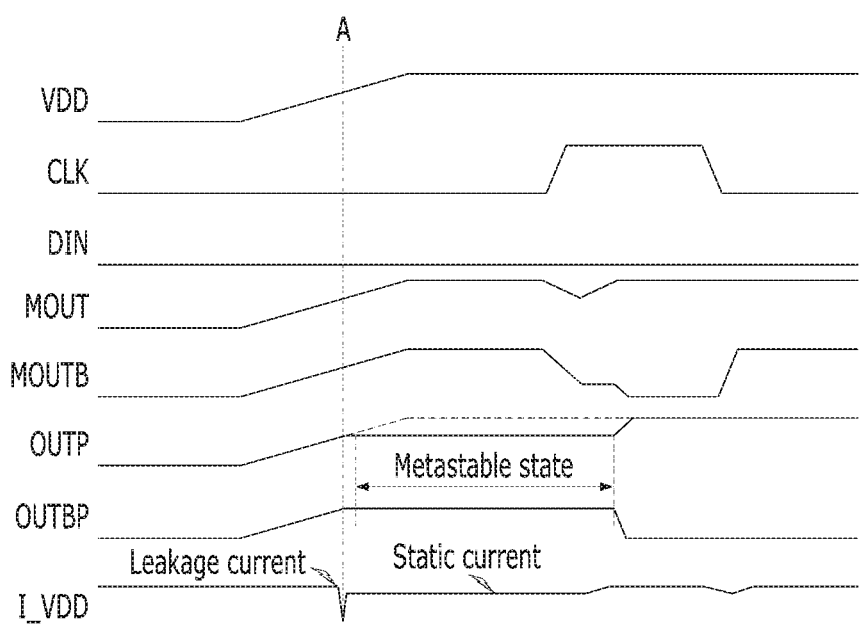
FIG. 2 is a signal waveform diagram for describing the operation of the flip-flop illustrated in FIG. 1.

FIG. 2 is a signal waveform diagram describing the operation of the flip-flop 100 illustrated in FIG. 1. The reference symbols denoting the nodes of the flip-flop 100 in FIG. 1 are used in FIG. 2 as reference symbols denoting signals corresponding to the nodes. For example, in the signal waveform diagram of FIG. 2, differential output signals denoting as OUTP and OUTBP are signals corresponding to the differential output nodes OUTP and OUTBP in FIG. 1, and thus, the same reference symbols are used.

FIG. 2 shows a state in which the clock CLK is logic low in an initial operation. The initial operation may include a boot-up operation of a system in which a power supply voltage VDD begins to be supplied and increases. In the case where the clock CLK is logic low, both the differential output signals OUTP and OUTBP of the sense amplifier circuit 110 may be driven to logic high levels. Therefore, as the inputs of the latch circuit 120 become in a floating state, the flip-flop 100 may become in a metastable state at a certain time A in the initial operation. As a result, as a substantial amount of leakage current or static current is generated, an influence may be exerted on current I_VDD which flows through the flip-flop 100.

As described above, there may occur a case where, after a system in which the flip-flop 100 is included is booted up, the sense amplifier circuit 110 or the latch circuit 120 becomes in a metastable state. This may result in a significant increase in leakage current in the system which has hundreds of input and output lines, and due to this fact, the operation margin of the entire system may be reduced.

Also, when the sense amplifier circuit 110 or the latch circuit 120 becomes out of the metastable state, the output value thereof may be randomly determined, and the system may fall into an unknown state. Assuming the worst case, a system boot-up may fail.

Figure 3:
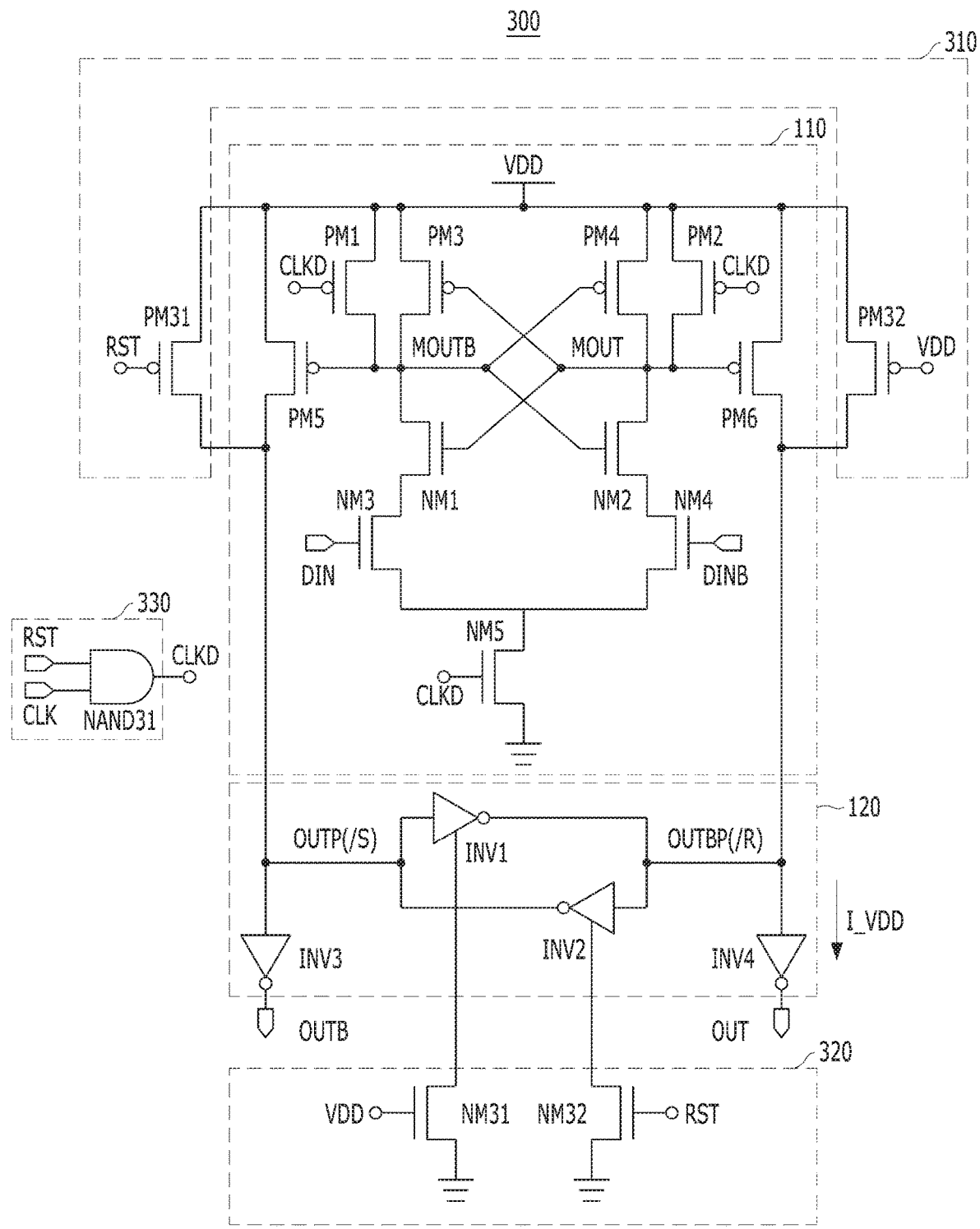
FIG. 3 is a circuit diagram illustrating a flip-flop in accordance with an embodiment of the disclosure.

FIG. 3 is a circuit diagram illustrating a flip-flop 300 in accordance with an embodiment of the disclosure. The same reference symbols will be used for components as those used for the flip-flop 100 of FIG. 1, and repeated descriptions will be omitted herein. Referring to FIG. 3, the flip-flop 300 may include a sense amplifier circuit 110, a latch circuit 120, a precharge circuit 310, a control circuit 320 and a reset circuit 330.

The sense amplifier circuit 110 may generate differential output signals by sensing and amplifying the level difference of differential input signals DIN and DINB in response to a clock signal, and may output the generated differential output signals to first and second nodes OUTP and OUTBP, respectively. The latch circuit 120 may feed back and latch the differential output signals between the first and second nodes OUTP and OUTBP.

The sense amplifier circuit 110 and the latch circuit 120 may be configured by PMOS transistors PM1 to PM6, NMOS transistors NM1 to NM5 and inverters INV1 to INV4 as described above with reference to FIG. 1. According to the embodiment of the disclosure, the sense amplifier circuit 110 may receive a reset clock signal CLKD, which is the clock signal CLK reset by the reset circuit 330, instead of the clock signal CLK.

In response to an initialization signal RST, the precharge circuit 310 may precharge the first node OUTP of the first and second nodes OUTP and OUTBP to a power supply voltage VDD. The precharge circuit 310 may include a first PMOS transistor PM31 which is coupled between the first node OUTP and the terminal of the power supply voltage VDD and receives the initialization signal RST through the gate thereof. The precharge circuit 310 may include a second PMOS transistor PM32 which is coupled between the second node OUTBP and the terminal of the power supply voltage VDD and receives the power supply voltage VDD through the gate thereof.

The initialization signal RST may be activated to a logic low level during the initial operation period of the flip-flop 300. If the initialization signal RST is activated to the logic low level, the first PMOS transistor PM31 may be turned on, and couples the first node OUTP and the terminal of the power supply voltage VDD. At this time, the second PMOS transistor PM32 may be turned off by the power supply voltage VDD.

The performance of an SAFF such as a setup/hold time tSH and a clock-to-output time tCO may be determined by the capacitance of the input/output nodes of the sense amplifier circuit 110 and the latch circuit 120, i.e., the first and second nodes OUTP and OUTBP. As the capacitance of the first and second nodes OUTP and OUTBP is increased, the setup/hold time tSH and the clock-to-output time tCO may be increased to thereby deteriorate the performance of the SAFF.

In order to lower the negative effect of the capacitance, the precharge circuit 310 may precharge the first and second nodes OUTP and OUTBP during the initial operation period, thereby reducing the loads of the first and second nodes OUTP and OUTBP. However, because the precharge circuit 310 is coupled to the latch circuit 120 at the first and second nodes OUTP and OUTBP, there may be a collision between the driving of the precharge circuit 310 and the driving of the latch circuit 120 at the first and second nodes OUTP and OUTBP. As a result, a static current path may be formed.

According to the embodiment of the disclosure, the flip-flop 300 may include the control circuit 320, and may block the current path of the latch circuit 120. When the precharge circuit 310 may be implemented by using PMOS transistors of a relatively large size to offset the driving of the latch circuit 120, the control circuit 320 may reset the latch circuit 120 through NMOS transistors of a relatively small size.

In detail, the control circuit 320 may control the feedback of the differential output signals between the first and second nodes OUTP and OUTBP, in response to the initialization signal RST. In response to the initialization signal RST, the control circuit 320 may block the feedback of the differential output signal from the second node OUTBP to the first node OUTP.

Referring to FIG. 3, the control circuit 320 may include a first NMOS transistor NM31 which is coupled between the first inverter INV1 and the terminal of a ground voltage, and receives the power supply voltage VDD through the gate thereof. The control circuit 320 may include a second NMOS transistor NM32 which is coupled between the second inverter INV2 and the terminal of the ground voltage, and receives the initialization signal RST through the gate thereof.

If the initialization signal RST is activated to the logic low level during the initial operation period of the flip-flop 300, the second NMOS transistor NM32 may be turned off and block the coupling of the second inverter INV2 and the terminal of the ground voltage. As the second inverter INV2 is deactivated, the feedback of the differential output signal from the second node OUTBP to the first node OUTP may be blocked. At this time, the first NMOS transistor NM31 may be turned on by the power supply voltage VDD and activate the first inverter INV1.

According to the embodiment of the disclosure, the flip-flop 300 may include the reset circuit 330, and may block the current path of the sense amplifier circuit 110. The reset circuit 330 as a clock gating circuit may fix the initial value of the clock signal CLK.

Referring to FIG. 3, the reset circuit 330 may include an AND gate NAND31 which performs an AND operation on the clock signal CLK and the initialization signal RST as inputs. In response to the initialization signal RST which is activated to the logic low level within the initial operation period, the reset circuit 330 may reset the clock signal CLK and output the reset clock signal CLKD to the sense amplifier circuit 110.

Figure 4:
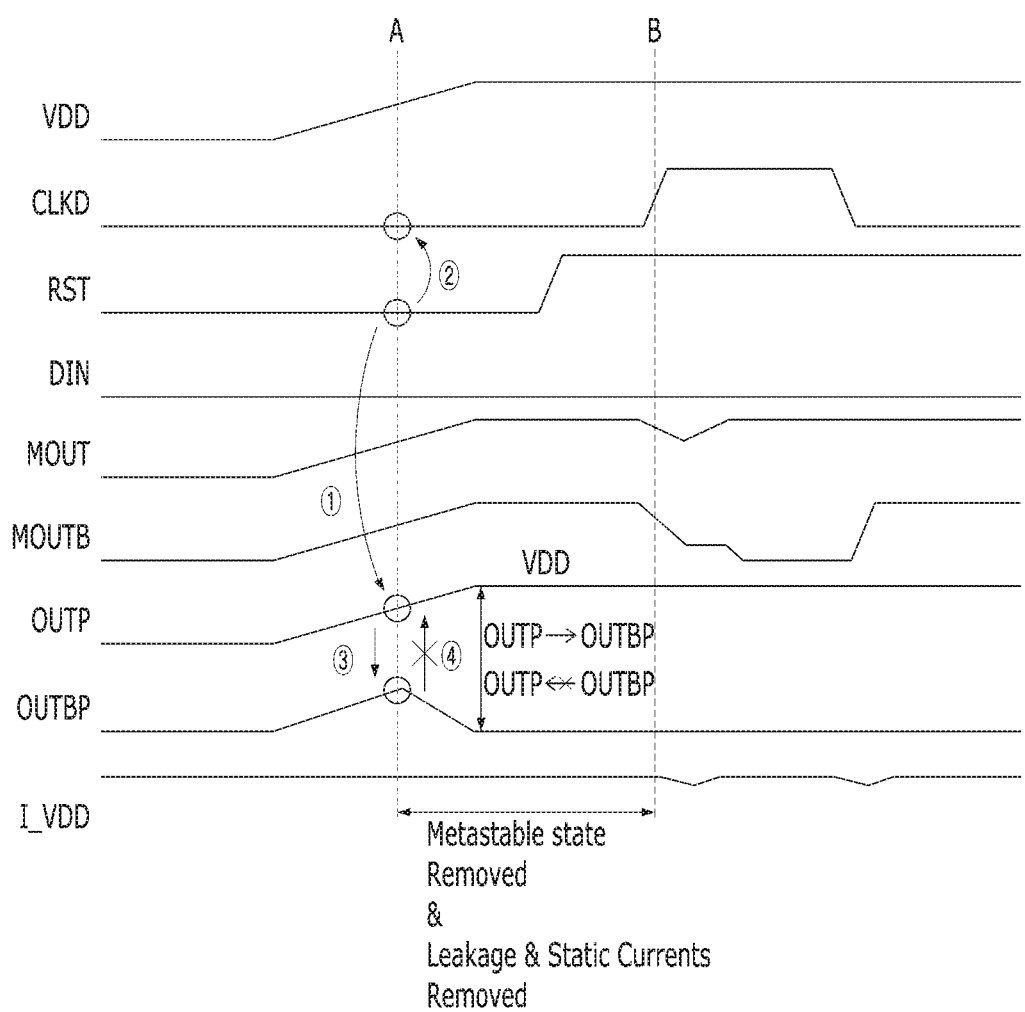
FIG. 4 is a signal waveform diagram for describing the operation of the flip-flop illustrated in FIG. 3.

FIG. 4 is a signal waveform diagram for describing the operation of the flip-flop 300 illustrated in FIG. 3. The reference symbols denoting the nodes of the flip-flop 300 in FIG. 3 are used in FIG. 4 as reference symbols denoting signals corresponding to the nodes. For example, in the signal waveform diagram of FIG. 4, differential output signals OUTP and OUTBP are signals corresponding to the differential output nodes OUTP and OUTBP in FIG. 3, and thus, the same reference symbols are used.

The initialization signal RST may be activated to the logic low level within the initial operation period and then deactivated to a logic high level. In response to the initialization signal RST which is activated to the logic low level, the precharge circuit 310 may drive the first node OUTP to the level of the power supply voltage VDD(①). At this time, the reset clock signal CLKD may be generated, as the initial value of the clock signal CLK is fixed by the reset circuit 330(②), and the current path of the sense amplifier circuit 110, which operates in response to the reset clock signal CLKD, may be blocked.

Further, in response to the initialization signal RST, the control circuit 320 may deactivate the second inverter INV2 of the latch circuit 120. Accordingly, the latch circuit 120 may drive the second node OUTBP to the level of the ground voltage based on the first node OUTP driven to the level of the power supply voltage VDD(③), and may block the feedback from the second node OUTBP to the first node OUTP(④). As a consequence, the flip-flop 300 in accordance with the embodiment of the disclosure may prevent a current path from being formed during the initial operation period, and may quickly and stably drive the output nodes OUTP and OUTBP to different levels, thereby ensuring an initial state. After the initial operation period, the initialization signal RST is deactivated to a logic high level, and the flip-flop 300 may properly operate in response to the activation of the clock signal CLK, i.e., the reset clock signal CLKD, at a time B.

Although various embodiments have been described for illustrative purposes, it will be apparent to those skilled in the art that various changes and modifications may be made without departing from the spirit and scope of the invention as defined in the following claims.

What is claimed is:

1. A semiconductor integrated circuit comprising:
   a sense amplifier circuit configured to generate differential output signals by sensing and amplifying a level difference of differential input signals in response to a clock signal, and output the differential output signals to first and second nodes, respectively;
   a latch circuit configured to feedback and latch the differential output signals between the first and second nodes;
   a control circuit configured to control the feedback of the differential output signals between the first and second nodes in response to an initialization signal; and
   a reset circuit configured to fix an initial value of the clock signal by resetting the clock signal in response to the initialization signal, and output the reset clock signal to the sense amplifier circuit,
   wherein the control circuit controls the feedback by blocking the feedback of the differential output signals from the second node to the first node.

2. The semiconductor integrated circuit according to claim 1, further comprising a precharge circuit configured to precharge the first node to a power supply voltage in response to the initialization signal.

3. The semiconductor integrated circuit according to claim 2, wherein the precharge circuit comprises:
   a first PMOS transistor coupled between the first node and a terminal of the power supply voltage, and configured to receive the initialization signal through a gate thereof; and
   a second PMOS transistor coupled between the second node and the terminal of the power supply voltage, and configured to receive the power supply voltage through a gate thereof.

4. The semiconductor integrated circuit according to claim 1, wherein the latch circuit comprises:
   a first inverter configured to invert a signal of the first node and output an inverted signal to the second node; and
   a second inverter configured to invert a signal of the second node and output an inverted signal to the first node.

5. The semiconductor integrated circuit according to claim 4, wherein the control circuit comprises:
   a first NMOS transistor coupled between the first inverter and a terminal of a ground voltage, and configured to receive the power supply voltage through a gate thereof; and
   a second NMOS transistor coupled between the second inverter and the terminal of the ground voltage, and configured to receive the initialization signal through a gate thereof.

6. The semiconductor integrated circuit according to claim 5, wherein the initialization signal is activated to a logic low level within an initial operation period of the semiconductor integrated circuit.

7. The semiconductor integrated circuit according to claim 6, wherein, in response to the initialization signal activated to the logic low level, the second NMOS transistor is turned off and deactivates the second inverter.

8. The semiconductor integrated circuit according to claim 1, wherein the reset circuit comprises an AND gate which performs an AND operation on the clock signal and the initialization signal as inputs.

9. A semiconductor integrated circuit comprising:
   a reset circuit configured to fix an initial value of a clock signal by resetting the clock signal in response to an initialization signal which is activated to a logic low level within an initial operation period;
   a sense amplifier circuit configured to generate differential output signals by sensing and amplifying a level difference of differential input signals in response to the reset clock signal, and output the generated differential output signals to first and second nodes, respectively;
   a latch circuit configured to feedback and latch the differential output signals between the first and second nodes; and
   a control circuit configured to block the feedback of the differential output signals from the second node to the first node, in response to the initialization signal.

10. The semiconductor integrated circuit according to claim 9, further comprising a precharge circuit configured to precharge the first node to a power supply voltage, in response to the initialization signal.

11. The semiconductor integrated circuit according to claim 9, wherein the reset circuit comprises an AND gate which performs an AND operation on the clock signal and the initialization signal as inputs and outputs the reset clock signal.

12. The semiconductor integrated circuit according to claim 9, wherein the sense amplifier circuit comprises:
   first and second PMOS transistors coupled between a terminal of a power supply voltage and intermediate output nodes, respectively, and configured to receive the reset clock signal through gates thereof, respectively;
   third and fourth PMOS transistors coupled in parallel with the first and second PMOS transistors, respectively, and having gates which are cross-coupled with the intermediate output nodes, respectively;
   fifth and sixth PMOS transistors coupled between the terminal of the power supply voltage and the first and second nodes, respectively, and having gates which are coupled with the intermediate output nodes, respectively;

first and second NMOS transistors coupled with the third and fourth PMOS transistors, respectively, and having gates which are cross-coupled with the intermediate output nodes, respectively;

third and fourth NMOS transistors coupled with the first and second NMOS transistors, respectively, and configured to receive the differential input signals through gates thereof, respectively; and a fifth NMOS transistor coupled between the third and fourth NMOS transistors and a terminal of a ground voltage, and configured to receive the reset clock signal through a gate thereof.

13. A flip-flop comprising:

a sense amplifier circuit configured to generate differential output signals by sensing and amplifying a level difference of differential input signals in response to a clock signal, and output the differential output signals to first and second nodes, respectively;

a latch circuit including first and second inverters which are coupled in a form of an inverter chain between the first and second nodes, and configured to latch the differential output signals;

a first NMOS transistor coupled between the first inverter and a terminal of a ground voltage, and configured to receive a power supply voltage through a gate thereof;

a second NMOS transistor coupled between the second inverter and the terminal of the ground voltage, and configured to receive an initialization signal through a gate thereof; and a reset circuit configured to fix an initial value of the clock signal by resetting the clock signal in response to the initialization signal, and output the reset clock signal to the sense amplifier circuit, wherein the initialization signal is activated to a logic low level within an initial operation period of the flip-flop.

14. The flip-flop according to claim 13, further comprising:

a first PMOS transistor coupled between the first node and a terminal of the power supply voltage, and configured to receive the initialization signal through a gate thereof; and a second PMOS transistor coupled between the second node and the terminal of the power supply voltage, and configured to receive the power supply voltage through a gate thereof.

15. The flip-flop according to claim 13, wherein, if the initialization signal is activated to the logic low level, the first PMOS transistor is turned on and couples the first node and the terminal of the power supply voltage, and the second NMOS transistor is turned off and blocks coupling of the second inverter and the terminal of the ground voltage.

16. The flip-flop according to claim 13, wherein the reset circuit comprises an AND gate configured to perform an AND operation on the clock signal and the initialization signal as inputs, and output a signal obtained by performing the AND operation, to the sense amplifier circuit.

17. An integrated circuit comprising:

a differential amplifier configured to amplify differential signals from first and second input nodes and output amplified differential signals to first and second output nodes, respectively;

a latch configured to feedback and latch the amplified differential signals between the first and second output nodes;

a precharger configured to precharge the first output node to a logic high level in response to a control signal enabled at an initial operation of the amplifier;

a blocking circuit configured to block the feedback of the amplified differential signals from the second output node to the first output node in response to the control signal; and a reset circuit configured to fix an initial value of a clock signal by resetting the clock signal in response to an initialization signal, and output the reset clock signal to the differential sense amplifier circuit.

* * * * *